United States Patent
Feng et al.

(10) Patent No.: US 8,058,706 B2
(45) Date of Patent: Nov. 15, 2011

(54) DELAMINATION RESISTANT PACKAGED DIE HAVING SUPPORT AND SHAPED DIE HAVING PROTRUDING LIP ON SUPPORT

(75) Inventors: Chien-Te Feng, Shindian (TW); Kazuaki Ano, Hayami-Gun (JP); Frank Yu, Chung Ho (TW); Trevor Liu, Chung Ho (TW)

(73) Assignee: Texas Instruments Incorporated, Dallas, TX (US)

( * ) Notice: Subject to any disclaimer, the term of this patent is extended or adjusted under 35 U.S.C. 154(b) by 162 days.

(21) Appl. No.: 12/555,646

(22) Filed: Sep. 8, 2009

(65) Prior Publication Data

US 2011/0057296 A1     Mar. 10, 2011

(51) Int. Cl.
*H01L 29/06*         (2006.01)
(52) U.S. Cl. ............... 257/618; 257/676; 257/E23.002; 257/E23.052; 257/E21.599
(58) Field of Classification Search .............. 257/618, 257/706, 777, 676, E23.052, E23.002, E21.599; 438/113, 164, 412
See application file for complete search history.

(56) References Cited

U.S. PATENT DOCUMENTS

| | | | |
|---|---|---|---|
| 6,489,178 B2* | 12/2002 | Coyle et al. | 438/51 |
| 7,067,927 B1* | 6/2006 | Mostafazadeh | 257/777 |
| 7,723,840 B2* | 5/2010 | Bathan et al. | 257/701 |
| 7,799,610 B2* | 9/2010 | Tan et al. | 438/110 |
| 2004/0245652 A1* | 12/2004 | Ogata | 257/777 |

* cited by examiner

*Primary Examiner* — Jasmine Clark
(74) *Attorney, Agent, or Firm* — Yingsheng Tung; Wade J. Brady, III; Frederick J. Telecky, Jr.

(57) ABSTRACT

A packaged electronic device includes a thickness shaped IC die including a top portion, top surface, active circuitry, bottom portion and bottom surface. A cross sectional area of the bottom surface is ≧5% less than a cross sectional area of the top surface to provide a protruding lip having a bottom lip surface. A package substrate includes a top substrate surface including substrate bonding sites, a bottom substrate surface, and a die support structure on the top substrate surface having a gap region. The bottom lip surface of the IC die is secured to the die support structure and the bottom surface of the IC die extends below the die support structure into the gap region. Coupling connectors couple the bonding features on the IC die to the substrate bonding sites.

17 Claims, 5 Drawing Sheets

DELAMINATION RESISTANT PACKAGED DIE HAVING SUPPORT AND SHAPED DIE HAVING PROTRUDING LIP ON SUPPORT

FIELD

Disclosed embodiments relate to assembly and packaging of electronic devices including integrated circuit (IC) die, and more particularly, to delamination resistant packaged electronic devices including exposed IC substrate (e.g., silicon) embodiments.

BACKGROUND

Delamination of a packaged IC die from its mounting surface, which is commonly triggered by die attach stress, is a known problem. One type of die attach stress (generally referred to as "differential coefficients of thermal expansion (CTE) stress") is induced by heating (or cooling) a packaged IC die that arises from forces produced by the large differential CTE between the IC die and the die mounting surface (e.g., a die attach pad) that is often present, such as when the IC die comprises silicon and the die pad comprises copper.

A window pad type of lead frame is a type of lead frame that is used for construction of electronic packages. This type of lead frame is characterized by an opening (or "window") located in the center of the die pad. Due to the reduced contact area between the IC die and the window pad lead frame, such arrangements help to prevent delamination of the mounted IC die from the lead frame. However, such arrangements generally have poor thermal performance due to the high thermal resistance of the epoxy-mold compound of the package that is between the IC and a heat sink (e.g. the ambient) in such arrangements.

To address thermal performance, some packages provide direct exposure of a portion of the IC die (e.g., the bottom of a silicon die) to an external heat sink (e.g. to a mother board or to the ambient), to bypass the thermal resistance of the package and thus improve the thermal performance of the packaged IC. Such packages are generally referred to as exposed silicon packages. Conventional exposed silicon packages include a solid (window-less) die pad, wherein the top surface of the IC die comprising active circuitry is attached by a die adhesive (e.g., epoxy) to a die pad that has an area substantially less then the area of the IC die. The bottom of the IC die is substantially coplanar with respect to the outer surface of the package and is thus exposed for coupling to an external heat sink.

In one alternate arrangement, an exposed silicon package includes a window pad lead frame. In this arrangement, an opening is formed in the central portion of the die-attach pad as a die-mounting ring for exposing one side of an IC die. The IC die has a conventional uniform shape (i.e. the cross sectional area of the IC die is constant in its thickness direction). The exposed surface of the IC die is recessed with the respect to the outer surface of the package which provides a cavity region that allows external cooling media to directly contact the exposed side of the IC die through the cavity. The exposed surface of the integrated circuit die is cooled, for example, with a cooling fluid, a heatsink, or a thermo-electric refrigeration unit in contact with the exposed side of the IC die.

Exposed silicon packages have several known problems. Problems for conventional exposed silicon packages include bleeding of the die attach adhesive (e.g., epoxy) onto the top surface of the IC die which can result in bonding and reliability problems, as well as die tilt. Die tilt can cause leakage of molding resin commonly referred to in the art as "mold flush", as well as die cracking. In addition, both conventional exposed silicon packages and the alternate arrangement described above do not provide a mold lock to the IC substrate (e.g., silicon), so that ambient moisture can enter the packaged IC and reach the IC die, and as a result can cause reliability problems including delamination.

SUMMARY

Embodiments described herein include packaged electronic devices that include thickness shaped IC die. Thickness shaped IC die disclosed herein have cross sectional areas that vary in the thickness direction of the IC die to provide a protruding lip on a top portion of the IC die that includes the active circuitry. In one embodiment the thickness shaped IC die is T-shaped.

Thickness shaped IC die described herein can be contrasted with conventional IC die that provide a constant cross sectional area along its thickness direction. Thickness shaped IC die disclosed herein form a mold lock with package substrates (e.g., lead frames or board substrates) that comprise a die support structure comprising at least two opposing edges having a gap region between the opposing edges. The bottom of the protruding lip of the IC die is secured to the die support structure and the bottom surface of the IC die extends below the die support structure into the gap region to form a mold lock, which in one embodiment extends sufficiently to allow the bottom surface of the substrate silicon for the thickness shaped IC die to directly contact a heat sink.

Since only a small radially outward portion of the area of the thickness shaped IC die is in contact with the die support structure, that being the protruding lip of the thickness shaped IC die, disclosed embodiments reduce differential CTE induced delamination of the IC die from the die support structure. Disclosed embodiments also overcome problems associated with conventional exposed silicon packages include bleeding of the die attach adhesive (e.g., epoxy) onto the top active circuitry comprising surface of the IC die which can result in bonding and reliability problems, as well as die tilt which reduces mold flush and die cracking.

Moreover, the mold lock provided by disclosed embodiments solve the reliability (e.g., delamination) problem that plagues all exposed silicon packages associated with ambient moisture penetration through the package to reach the thickness shaped IC die. Reducing or eliminating ambient moisture penetration through the package to reach the thickness shaped IC die reduces reliability problems including delamination associated with moisture penetration.

Disclosed embodiments also include methods for sawing a wafer or wafer portion to form a plurality of thickness shaped singulated IC die. In disclosed embodiments, a larger width is cut in the scribe line area beginning at the bottom surface of the wafer, while a smaller width is cut for the remaining portion of the wafer thickness including the top portion comprising a top surface including active circuitry to form the thickness shaped singulated die.

DETAILED DESCRIPTION

Figure 1:
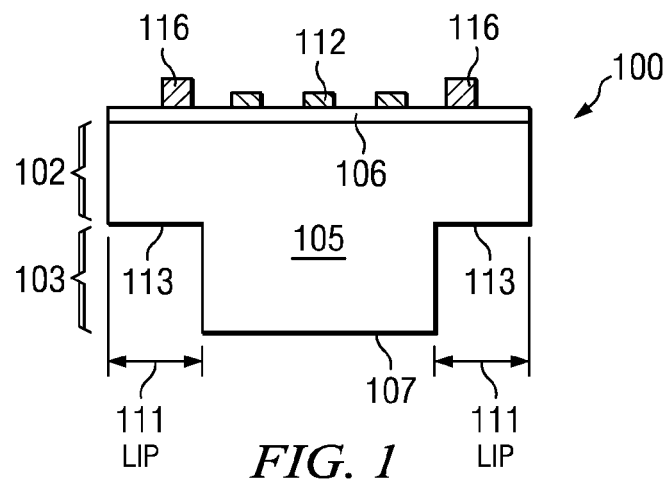
FIG. 1 shows a cross sectional depiction of a thickness shaped IC die including a protruding lip, according to an embodiment of the invention.

Disclosed embodiments are described with reference to the attached figures, wherein like reference numerals are used throughout the figures to designate similar or equivalent elements. The figures are not drawn to scale and they are provided merely to illustrate the disclosed embodiments. Several disclosed aspects are described below with reference to example applications for illustration. It should be understood that numerous specific details, relationships, and methods are set forth to provide a full understanding of the disclosed embodiments. One having ordinary skill in the relevant art, however, will readily recognize that embodiments of the invention can be practiced without one or more of the specific details or with other methods. In other instances, well-known structures or operations are not shown in detail to avoid obscuring the disclosure. The disclosed embodiments are not limited by the illustrated ordering of acts or events, as some acts may occur in different orders and/or concurrently with other acts or events. Furthermore, not all illustrated acts or events are required to implement a methodology in accordance with embodiments of the invention.

Embodiments described herein include packaged electronic devices that include thickness shaped IC die. Thickness shaped IC die disclosed herein have cross sectional areas that vary in the thickness direction of the thickness shaped IC die to provide a protruding lip on a top portion of the thickness shaped IC die that includes the active circuitry. In one embodiment the thickness shaped IC die is T-shaped, so that the area of the top portion of the thickness shaped IC die that includes the active circuitry is larger than the area of the bottom portion of the thickness shaped IC die.

The package substrate (e.g., lead frame or laminate substrate) disclosed herein comprise a die support structure comprising at least two opposing edges having a gap region between the opposing edges. When assembled, the bottom of the protruding lip of the thickness shaped IC die is secured (e.g., with an adhesive, such as thermally conductive Ag epoxy) to the die support structure and the bottom surface of the thickness shaped IC die extends below the die support structure into the gap region to form a mold lock. In one embodiment, the bottom of the IC die substrate (e.g., silicon) extends sufficiently to be substantially coplanar with the package (e.g., the mold compound), which allows direct contact to a heat sink for enhanced heat transfer from the thickness shaped IC die.

One disclosed aspect relates to thickness shaped IC die having a protruding lip on the top portion of the IC die. In contrast to thickness shaped IC die disclosed herein, conventional IC die after fabrication begin at a wafer thickness from about 500 µm to 775 µm, are background to a thickness of 50 to 125 µm, and are then singulated to result in IC die having a constant cross sectional area along their entire thickness.

FIG. 1 shows a cross sectional depiction of a thickness shaped IC die 100 including a protruding lip on the top portion of the thickness shaped IC die 100 according to an embodiment of the invention. Thickness shaped IC die 100 includes a substrate 105, such as a silicon substrate, that comprises a top portion 102 comprising top surface 106 (e.g., semiconductor top surface) that includes active circuitry 112 formed thereon and a bottom portion 103 including a bottom surface 107. The active circuitry 112 formed on the top surface 106 comprises circuit elements that generally include transistors, diodes, capacitors, and resistors, as well as signal lines and other conductors that interconnect these various circuit elements.

The cross sectional area of the top portion 102 including top surface 106 is significantly greater than the cross sectional area of the bottom portion 103 including the bottom surface 107 to provide a protruding lip 111 that provides a T-shape. If the cross sectional area of top portion 102 including top surface 106 is represented as "A", the cross sectional area of bottom portion 103 including bottom surface 107 is at least 5% less, i.e. $\leq 0.95A$, and is typically $\leq 0.80A$, such as 0.40A to 0.80A. The protruding lip 111 includes a bottom lip surface 113.

Thickness shaped IC die 100 also includes a plurality of bonding features on its top surface 106 and/or bottom surface 107. The plurality of bonding features are shown as bond pads 116 on the top surface 106 in FIG. 1.

Figure 2A:
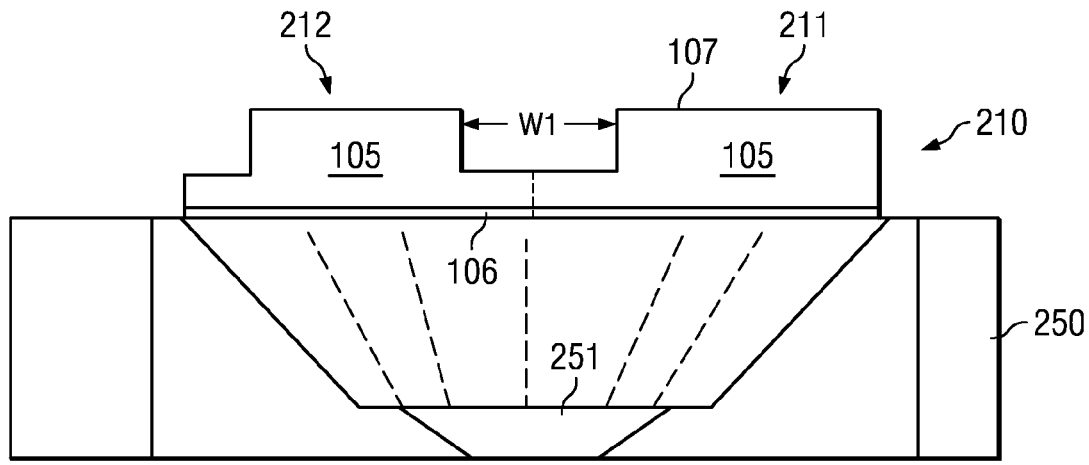
FIGS. 2A and 2B show cross sectional depictions of results following first and second wafer sawing steps, in an exemplary embodiment for forming thickness shaped IC die, according to an embodiment of the invention.
Figure 2B:
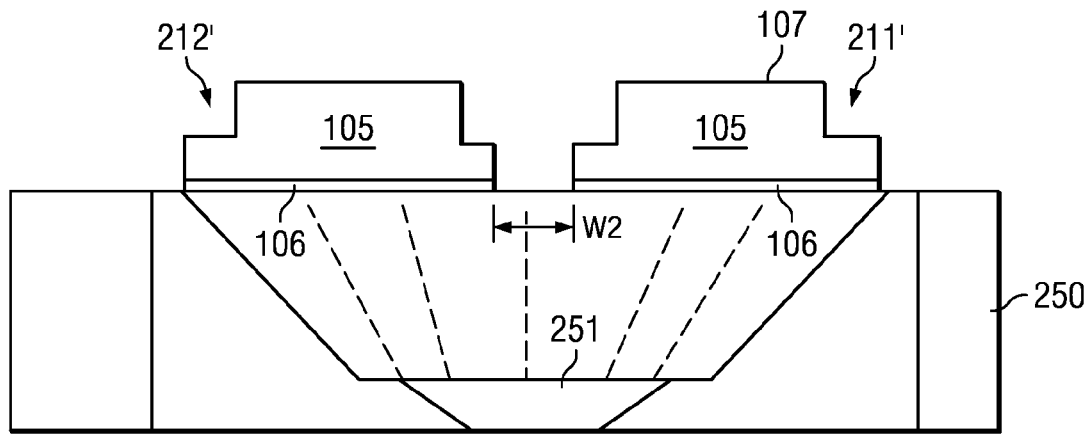

FIGS. 2A and 2B show cross sectional depictions of results following first and second wafer sawing steps using a laser sawing system, in an exemplary embodiment for forming thickness shaped IC die, according to an embodiment of the invention. Although the cutting is shown based on laser saw techniques, one or both saw steps described below can generally comprise rotary saw blade-based cutting systems (e.g., diamond-edged blades).

A wafer or wafer portion 210 is provided generally after backgrind having a plurality of IC die formed thereon. The wafer or wafer portion 210 is shown placed with its top surface 106 facing down (e.g., typically on a protective material, such as an adhesive) on a saw table 250 of a laser saw machine that includes a top side laser and a bottom side vision alignment system 251 for alignment using image data obtained from the top surface 106 of wafer or wafer portion 210. A laser can be used to first form a plurality of saw alignment marks (not shown, typically in locations over the scribe line areas) on the bottom surface 107 of the wafer or wafer portion 210.

FIG. 2A shows the wafer or wafer portion 210 after being cut a first time by a laser saw to provide a cut having a first (wider) width shown as W1 that is only partially through the thickness of the wafer or wafer portion 210, which as noted above is generally over the scribe line area between the IC die 211 and 212. FIG. 2B shows the wafer or wafer portion 210 after being cut a second time, this time cut by saw blade or laser saw technique following the previous wider saw path to provide a cut having a second (narrower) width W2, wherein W2<W1 to complete the cut through the thickness of wafer or wafer portion 210 to reach through the top surface 106 including active circuitry to provide a plurality of singulated shaped IC die including singulated IC die 211' and singulated IC die 212'. The ratio of W1:W2 is generally at least 1.5:1, and is typically from 4 to 15:1. In one particular embodiment, W1=200 µm and W2=20 µm.

Although the sawing operation described above shows sawing about ½ of the thickness of the wafer or wafer portion in each of the sawing steps, embodiments of the invention are in no way limited to this equal allocation of thickness sawed. For example, the first wider cut can cut 20 to 80% of the thickness of the wafer or wafer portion, with the second narrower cut accounting for the remainder of the thickness of the wafer or wafer portion. It is also be possible to form thickness shaped die by performing at least one cut from the top surface 106 of the wafer or wafer portion 210.

As described above, another aspect described herein relates to package substrates comprising a die support structure comprising at least two opposing edges on its top substrate surface having a gap region between the opposing edges. The gap regions are dimensioned so that the thickness shaped IC die can be assembled thereto so that the bottom surface of the thickness shaped IC die extends below the gap region, and the bottom lip surface of the IC fits on the die support structure so that it can be secured thereto.

Figure 3A:
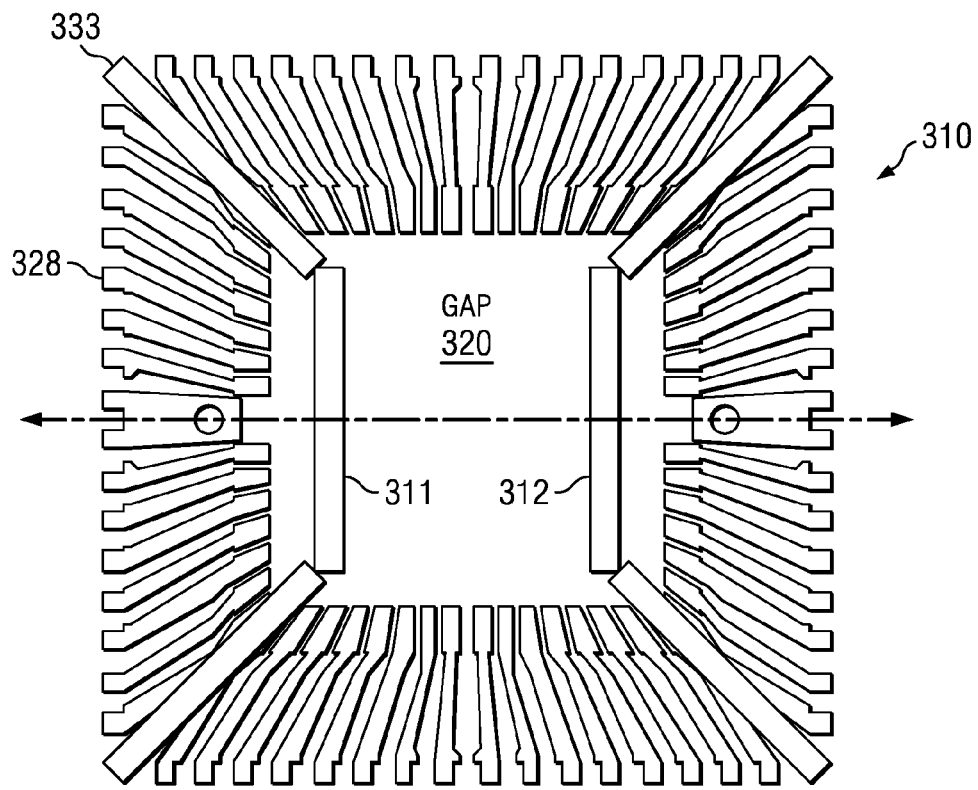
FIG. 3A shows an exemplary lead frame that comprises a die support structure having two opposing edges on its top substrate surface having a gap region between the opposing edges, according to an embodiment of the invention.
Figure 3B:
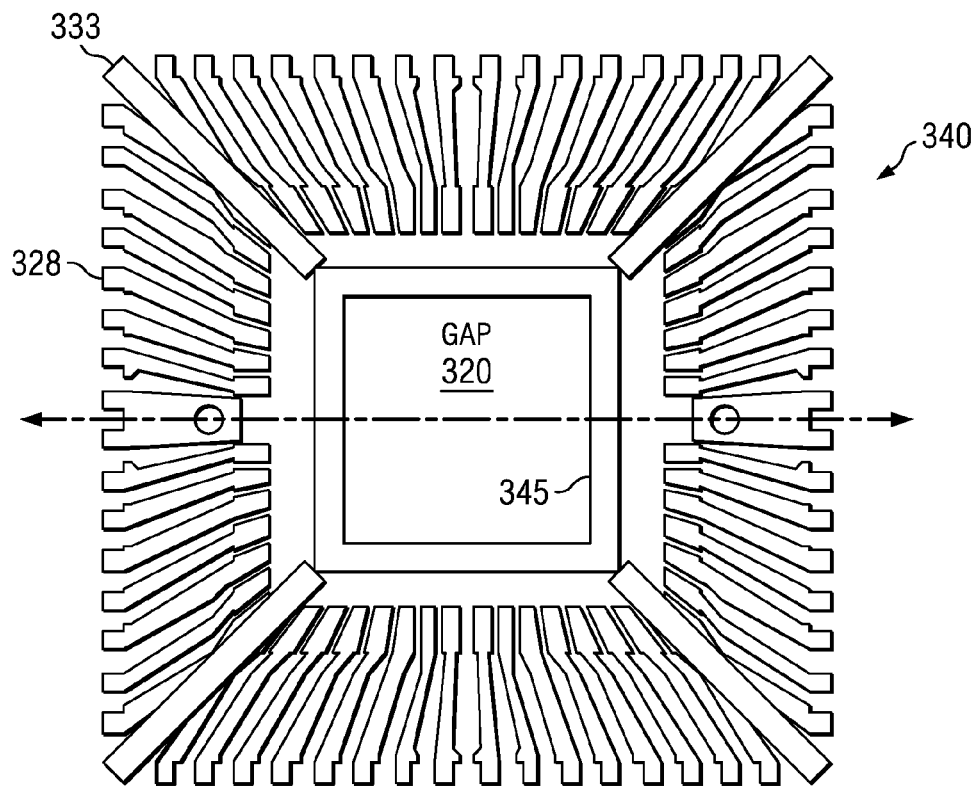
FIG. 3B shows an exemplary lead frame that comprises a die support structure having four edges that form a ring on its top substrate surface having a gap region inside the ring, according to an embodiment of the invention.

FIG. 3A shows an exemplary lead frame 310 that comprises a die support structure 311/312 having two opposing edges 311 and 312 having a gap region 320 between the opposing edges, according to an embodiment of the invention. Lead fingers 328 comprise the substrate bonding sites for lead frame 310 and define the topmost substrate surface for lead frame 310, while die support structure 311/312 defines the bottom substrate surface of lead frame 310 (FIGS. 3B and C show this aspect clearly). Support bars (or tie-bars) 333 shown are for supporting die support edges 311 and 312. The gap region 320 is dimensioned so that the thickness shaped IC die (not shown in FIG. 3A) can be assembled thereto so that the bottom surface of the thickness shaped IC die extends below the gap region 320, and the bottom lip surface of the thickness shaped IC die fits on the die support structure 311/312 so that it can be secured thereto.

FIG. 3B shows an exemplary lead frame 340 that comprises a die support structure having four edges that form a ring 345 having a gap region 320 inside the ring, according to an embodiment of the invention. The ring 345 is dimensioned so that the thickness shaped IC die can be assembled thereto so that the bottom surface of the IC die extends below the gap region, and the bottom lip surface of the IC fits on the ring 345 so that it can be secured thereto.

Figure 3C:
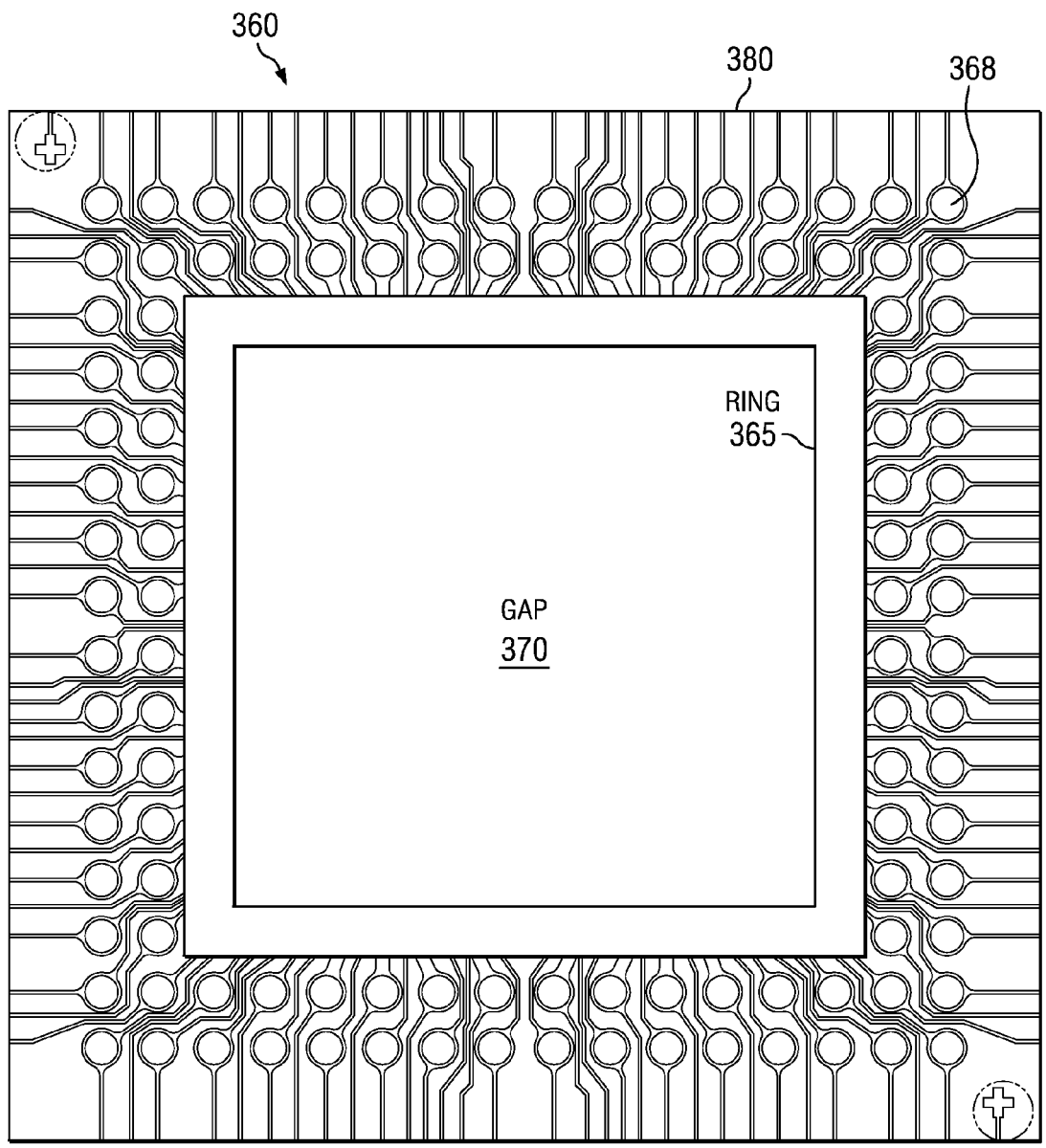
FIG. 3C shows an exemplary laminate substrate that comprises a die support structure having four edges that form a ring on its top substrate surface having a gap region inside the ring, according to an embodiment of the invention.

FIG. 3C shows an exemplary laminate substrate 360 that comprises a die support structure having four edges that form a ring 365 on its top substrate surface 380 having a gap region 370 inside the ring 365, according to an embodiment of the invention. The laminate substrate includes a plurality of land pads 368. In one embodiment the laminate substrate 360 comprises a BGA type printed circuit board, such as based on a polyimide substrate.

Figure 4A:
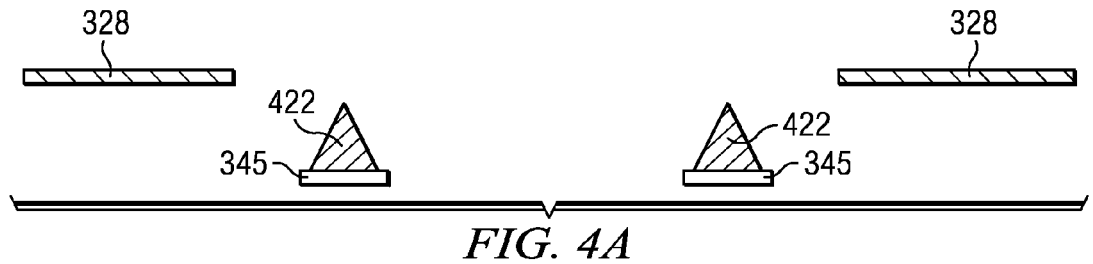
FIGS. 4A-C show steps in forming a packaged electronic device comprising a thickness shaped IC having a protruding lip bonded to a package substrate comprising a lead frame comprising a die support structure comprising at least two opposing edges having a gap region between the opposing edges, according to an embodiment of the invention.
Figure 4B:
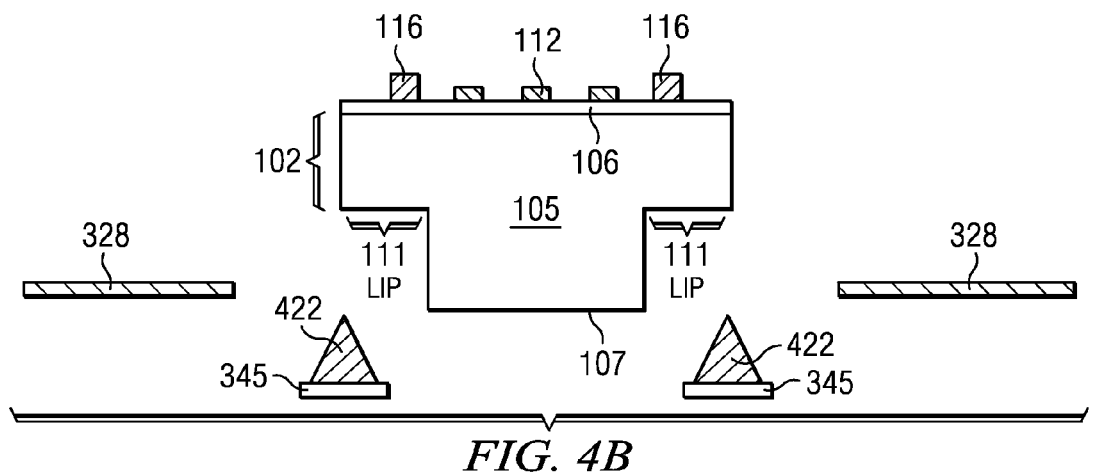
Figure 4C:
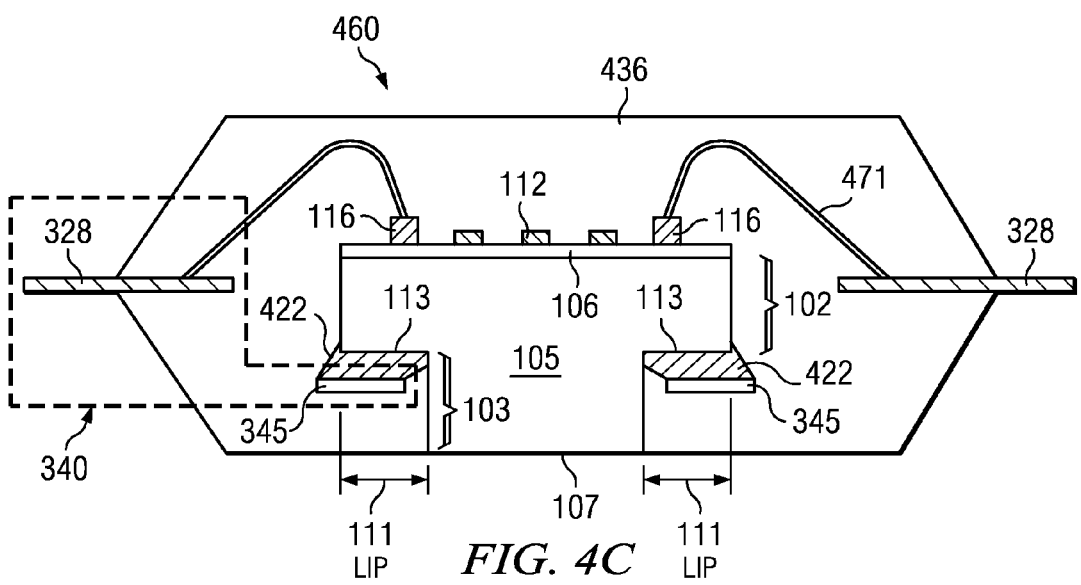

FIGS. 4A-C show steps in forming a packaged electronic device comprising a thickness shaped IC die having a protruding lip bonded to a package substrate comprising a lead frame comprising a die support structure comprising at least two opposing edges having a gap region between the opposing edges, according to an embodiment of the invention. The bottom lip surface of the thickness shaped IC die is secured to the die support structure and the bottom surface of the thickness shaped IC die extends below the die support structure. FIG. 4A is a cross section view of lead frame 340 along the cut line shown in FIG. 3B following an epoxy 422 applied to the ring 345. FIG. 4B is a cross section view along the cut line shown in FIG. 3B of lead frame 340 with the thickness shaped IC die 100 shown in FIG. 1 after pressing towards one another just before contact with ring 345.

FIG. 4C is a cross section view of a packaged electronic device 460 formed after thickness shaped IC die 100 is inserted through ring 345 so that the bottom lip surface 113 of the thickness shaped IC die 100 is secured to the ring 345 and the bottom surface 107 of the thickness shaped IC die 100 extends below the ring 345 into the gap region 320 provided by lead frame 340. Since only a small radially outward portion of the area of the thickness shaped IC die is in contact with the ring 345, that being the bottom surface 113 of the protruding lip 111 of the thickness shaped IC die 100, packaged electronic device 460 reduces differential CTE induced delamination of the IC die 100 from the die support structure (ring 345). This embodiment also overcome problems associated with conventional exposed silicon packages include bleeding of the die attach adhesive (e.g., epoxy) onto the top active circuitry comprising surface of the IC die which can result in bonding and reliability problems, as well as die tilt which reduces mold flush and die cracking.

In addition, packaged electronic device 460 solves the reliability (e.g., delamination) problem for all exposed silicon packages of ambient moisture entering the packaged IC and reaching the IC die, by providing a mold lock between the IC substrate 105 (e.g., silicon) and the package, so that reliability problems including delamination are significantly reduced or are eliminated.

Coupling connectors shown as bond wires 471 couple the bond pads 116 on thickness shaped IC die 100 to the substrate bonding sites shown as lead fingers 328. Mold encapsulant 436 is shown encapsulating packaged electronic device 460, except for the bottom surface 107 of the thickness shaped IC die 100 which is exposed to provide an exposed silicon package in the case substrate 105 comprises silicon. Since the IC substrate 105 (e.g., silicon) is exposed it can be assembled in direct contact with a heat sink, such as mother board (not shown).

Figure 5A:
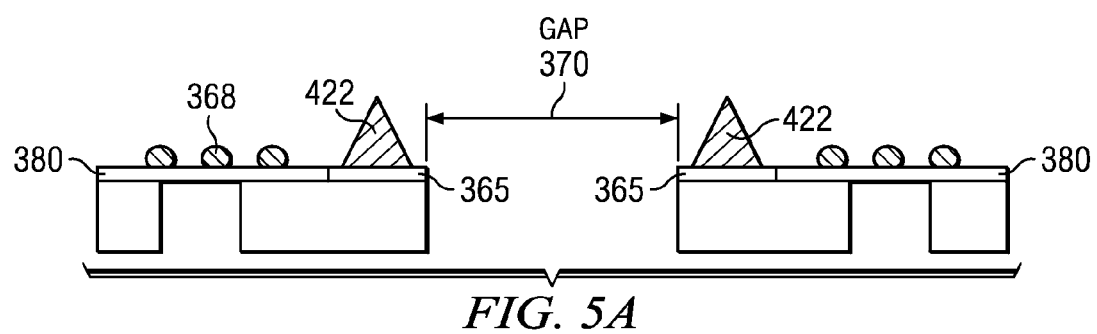
FIGS. 5A-C show steps in forming a packaged electronic device comprising a thickness shaped IC die having a protruding lip bonded to a package substrate comprising a laminate substrate comprising a die support structure comprising a support ring having a gap region inside the ring, according to an embodiment of the invention.
Figure 5B:
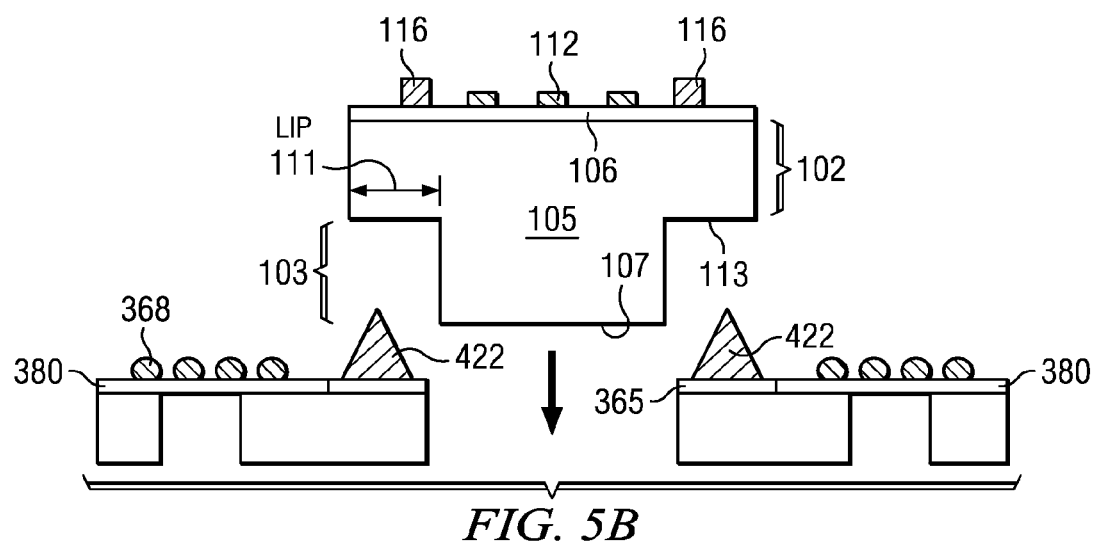
Figure 5C:
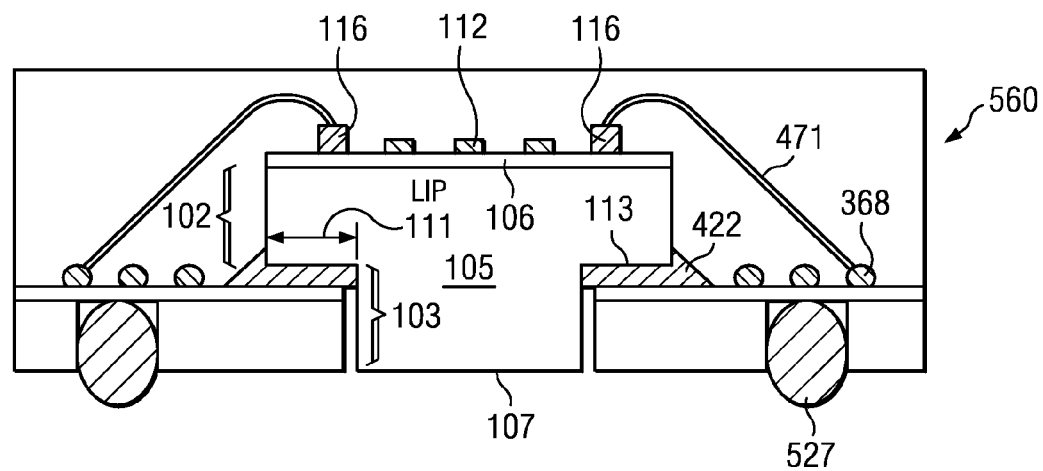

FIGS. 5A-C show steps in forming a packaged electronic device comprising a thickness shaped IC die having a protruding lip bonded to a package substrate comprising a laminate substrate comprising a die support structure comprising a support ring having a gap region inside the ring, according to an embodiment of the invention. FIG. 5A is a cross section view of laminate substrate 360 shown in FIG. 3C along a horizontal cut line following an epoxy 422 applied to the ring 365. FIG. 5B is a cross section view of the laminate substrate 360 with the thickness shaped IC die 100 shown in FIG. 1 after pressing towards one another just before contact with ring 365.

FIG. 5C is a cross section view of a packaged electronic device 560 formed after the thickness shaped IC die 100 is inserted through ring 365 so that the bottom lip surface 113 of the thickness shaped IC die 100 is secured to the ring 365 and the bottom surface 107 of the thickness shaped IC die 100 extends below the ring 365 into the gap region 370 provided by laminate substrate 360. Since only a small radially outward portion of the area of the thickness shaped IC die is in contact with the ring 345, that being the bottom surface 113 of the protruding lip 111 of the thickness shaped IC die 100, packaged electronic device 560 reduces differential CTE induced delamination of the IC die 100 from the die support structure (ring 365). This embodiment also overcomes problems associated with conventional exposed silicon packages include bleeding of the die attach adhesive (e.g., epoxy) onto the top active circuitry comprising surface of the IC die which can result in bonding and reliability problems, as well as die tilt.

In addition, packaged electronic device 560 solves the reliability (e.g., delamination) problem for all exposed silicon packages of ambient moisture entering the packaged IC and reaching the IC die, by providing a mold lock between the IC substrate 105 (e.g., silicon) and the package, so that reliability problems including delamination are significantly reduced or are eliminated.

Coupling connectors shown as bond wires 471 couple the bond pads 116 on thickness shaped IC die 100 to the substrate bonding sites shown as land pads 368. Laminate substrate 360 also includes a plurality of solder balls 527, such as in a ball grid array (BGA) configuration. Mold encapsulant 436 is shown encapsulating packaged electronic device 560, except for the bottom surface 107 of the thickness shaped IC die 100 which is exposed to provide an exposed silicon package in the case substrate 105 comprises silicon. Since the IC substrate 105 (e.g., silicon) is exposed it can be assembled in direct contact with a heat sink, such as mother board (not shown).

Embodiments of the invention can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, embodiments of the invention can be used in a variety of processes including bipolar, CMOS, BiCMOS and MEMS.

While various embodiments of the invention have been described above, it should be understood that they have been presented by way of example only, and not limitation. Numerous changes to the disclosed embodiments can be made in accordance with the disclosure herein without departing from the spirit or scope of the disclosed embodiments. For example, rather than or in addition to bond wires, in other embodiments the thickness shaped IC die includes through substrate vias (TSV), pillars or coined studs, which can be used as alternatives to the bond wires generally disclosed for coupling the plurality of bonding features on the thickness shaped IC die to said plurality of substrate bonding sites. Thus, the breadth and scope of embodiments of the invention should not be limited by any of the above explicitly described embodiments. Rather, the scope of the invention should be defined in accordance with the following claims and their equivalents.

Although the embodiments of invention have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting to embodiments of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

The invention claimed is:

1. A packaged electronic device, comprising:
a thickness shaped integrated circuit (IC) die having a top portion comprising a top surface including active circuitry and a bottom portion including a bottom surface, wherein a cross sectional area of said bottom surface is at least 5% less than a cross sectional area of said top surface to provide a protruding lip, said protruding lip including a bottom lip surface, said thickness shaped IC die having a plurality of bonding features on said top surface or said bottom surface;
a package substrate comprising a top substrate surface having a plurality of substrate bonding sites thereon and a bottom substrate surface, said package substrate comprising a die support structure comprising at least two opposing edges on said top substrate surface having a gap region between said opposing edges;
wherein said bottom lip surface of said thickness shaped IC die is secured to said die support structure and said bottom surface of said thickness shaped IC die extends below said die support structure into said gap region, and coupling connectors for coupling said plurality of bonding features on said thickness shaped IC die to said plurality of substrate bonding sites.

2. The packaged electronic device of claim 1, wherein said bottom portion has a uniform cross sectional area equal to said cross sectional area of said bottom surface and said top portion has a uniform cross sectional area equal to said cross sectional area of said top surface.

3. The packaged electronic device of claim 1, wherein said package substrate comprises a lead frame comprising a die pad and a plurality of lead fingers, wherein said gap region is formed in said die pad and said plurality of substrate bonding sites comprises said plurality of lead fingers.

4. The packaged device of claim 1, wherein said package substrate comprises a laminate substrate.

5. The packaged device of claim 4, wherein said bottom surface of said thickness shaped IC die is coplanar with said bottom substrate surface.

6. The packaged device of claim 4, wherein said die support structure comprises a four sided die support ring.

7. The packaged device of claim 6, wherein said four sided die support ring comprises a horizontal ring or a square ring.

8. The packaged device of claim 1, further comprising a thermally conductive adhesive positioned between said bottom lip surface of said protruding lip and said die support structure.

9. A method for forming exposed die packaged devices, comprising:
- providing (i) a wafer or wafer portion comprising a plurality of integrated circuit (IC) die, and (ii) a package substrate comprising a top substrate surface having a plurality of substrate bonding sites thereon and a bottom substrate surface, said package substrate comprising a die support structure comprising at least two opposing edges on said top substrate surface having a gap region between said opposing edges;
- sawing said wafer or said wafer portion to form a plurality of thickness shaped IC die, said plurality of thickness shaped IC die having a top portion comprising a top surface including active circuitry and a bottom portion including a bottom surface, wherein a cross sectional area of said bottom surface is at least 5% less than a cross sectional area of said top surface to provide a protruding lip, said protruding lip including a bottom lip surface, said plurality of thickness shaped IC die having a plurality of bonding features on said top surface or said bottom surface;
- wherein an area of said bottom surface fits within said gap region and wherein an area of said protruding lip>said area of said bottom surface;
- placing a first of said thickness shaped IC die so that said bottom lip surface is secured to said die support structure and said bottom surface of said first thickness shaped IC die extends below said die support structure, and
- connecting said bonding features on said first thickness shaped IC die to said substrate bonding sites on said package substrate.

10. The method of claim 9, wherein said sawing comprises a first saw step that cuts a portion of a thickness of said wafer or wafer portion in a scribe line area beginning at the bottom surface of said wafer or wafer portion to a first width, and then a second saw step to cut through a remaining portion of said thickness to a width narrower than said first width to form said plurality of said thickness shaped IC die.

11. The method of claim 10, wherein at least one of said first and second saw steps comprises laser sawing.

12. The method of claim 10, further comprising forming at least one laser alignment mark on said bottom surface before said first saw step.

13. A method for forming exposed die packaged devices comprising (i) a thickness shaped IC die having a top portion including a top surface having active circuitry and a bottom portion including a bottom surface, wherein a cross sectional area of said bottom surface is at least 5% less than a cross sectional area of said top surface to provide a protruding lip having a bottom lip surface, said IC die having a plurality of bonding features on said top surface or said bottom surface, and (ii) a package substrate comprising a top substrate surface having a plurality of substrate bonding sites thereon and a bottom substrate surface, said package substrate comprising a die support structure comprising at least two opposing edges on said top substrate surface having a gap region between said opposing edges, wherein an area of said bottom surface fits within said gap region and wherein an area of said protruding lip>said area of said bottom surface, comprising:
- placing said thickness shaped IC die so that said bottom lip surface is secured to said die support structure and said bottom surface of said thickness shaped IC die extends below said die support structure, and
- connecting said bonding features of said thickness shaped IC die to said substrate bonding sites on said package substrate.

14. The method of claim 13, wherein said bottom portion has a uniform cross sectional area equal to said cross sectional area of said bottom surface and said top portion has a uniform cross sectional area equal to said cross sectional area of said top surface.

15. The method of claim 13, wherein said package substrate comprises a lead frame comprising a die pad and a plurality of lead fingers, wherein said gap region is formed in said die pad and said plurality of substrate bonding sites comprises said plurality of lead fingers.

16. The method of claim 13, wherein said package substrate comprises a laminate substrate.

17. The method of claim 13, wherein said bottom surface of said thickness shaped IC die is coplanar with said bottom substrate surface.

* * * * *